(12) United States Patent
Lee et al.

(10) Patent No.: US 9,384,836 B2
(45) Date of Patent: Jul. 5, 2016

(54) CONTENT ADDRESSABLE MEMORY

(71) Applicant: REALTEK SEMICONDUCTOR CORP., Hsinchu (TW)

(72) Inventors: Hung-Yu Lee, Hsinchu (TW); Chien-Yuan Pao, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/541,646

(22) Filed: Nov. 14, 2014

(65) Prior Publication Data

US 2015/0138861 A1 May 21, 2015

(30) Foreign Application Priority Data

Nov. 15, 2013 (TW) .............................. 102141735 A (51) Int. Cl.
*G11C 15/04* (2006.01)

(52) U.S. Cl.
CPC ....................................... *G11C 15/04* (2013.01)

(58) Field of Classification Search
USPC ................................................ 365/49.1, 203
See application file for complete search history.

(56) References Cited

U.S. PATENT DOCUMENTS

| | | | | |
|---|---|---|---|---|
| 7,450,409 B1 * | 11/2008 | Maheshwari | .......... | G11C 15/04 365/154 |
| 8,233,302 B2 | 7/2012 | Arsovski et al. | | |
| 2003/0081442 A1 * | 5/2003 | Tsuda | .................... | G11C 15/04 365/49.17 |
| 2005/0083718 A1 * | 4/2005 | Lysinger | ................ | G11C 15/00 365/49.1 |
| 2008/0285322 A1 * | 11/2008 | Thummalapally | ... | G11C 11/405 365/49.12 |

* cited by examiner

*Primary Examiner* — Hoai V Ho
*Assistant Examiner* — Minh Dinh
(74) *Attorney, Agent, or Firm* — WPAT, PC; Justin King (57) ABSTRACT

This disclosure provides a content addressable memory which includes: a data memory cell for storing a data bit; a mask memory cell for storing a mask bit; and a comparing and readout unit connected to at least one read word line for receiving at least one read word signal, connected to at least one function bit line for receiving a search bit signal, and connected to the data memory cell and the mask memory cell for receiving the data bit and the mask bit; wherein the data memory cell is connected to a data-use write word line for receiving a data-use write word signal, the mask memory cell is connected to a mask-use write word line for receiving a mask-use write word signal, so as to decide whether a write bit signal can be written into the data bit and the mask bit through a pair of write bit lines.

10 Claims, 7 Drawing Sheets

CONTENT ADDRESSABLE MEMORY

This application claims the benefit of Taiwan application Serial No. 102141735, filed Nov. 15, 2013, the disclosure of which is incorporated by reference herein in its entirety.

TECHNICAL FIELD

The present disclosure relates to a content addressable memory (CAM), and more particularly, to a ternary content addressable memory (TCAM).

TECHNICAL BACKGROUND

A content addressable memory (CAM) includes an array of CAM cells arranged in rows and columns, in which each row of the CAM array corresponds to a word of stored contents. The CAM cells in a given row connected to a word line and a match line associated with the row. The match line may carry a signal that indicates whether the word stored in the row matches an input search word. A comparator circuit may compare the stored word with the search word and thus produce a match bit signal. The CAM can be classified into binary CAM and trinity CAM according to the number of possible states encoded in the memory cell.

Considering a binary CAM, each CAM cell includes a data memory cell and a comparator circuit. The data memory cell stores a data bit and a complementary data bit, and "0" and "1" are two possible states stored in each CAM cell. With respect to a trinity CAM, each CAM cell includes a data memory cell, a mask memory cell, and a comparator circuit. The data memory cell stores a data bit and a complementary data bit, and the mask memory cell stores a mask bit and a complementary mask bit. "0", "1" and "don't care" are three possible states stored in each CAM cell.

Conventionally, when a signal carried in the word line is logic HIGH or "1", the data bit may be read out of or written into the CAM cell through a bit line. However, the CAM cell may be subject to the "disturbance in word lines" problem, in which no data bit is read or written when the signal in the word line is logic HIGH or "1". This may cause data damage or fault operation. Consequently, it is in need to develop a new content addressable memory technique.

TECHNICAL SUMMARY

According to one aspect of the present disclosure, one embodiment providesa content addressable memory including: a data memory cell for storing a data bit; a mask memory cell for storing a mask bit; and a comparing and readout unit connected to at least one read word line for receiving at least one read word signal, connected to at least one function bit line for receiving a search bit signal, and connected to the data memory cell and the mask memory cell for receiving the data bit and the mask bit; wherein the data memory cell is connected to a data-use write word line for receiving a data-use write word signal, the mask memory cell is connected to a mask-use write word line for receiving a mask-use write word signal, so as to decide whether a write bit signal can be written into the data bit and the mask bit through a pair of write bit lines; wherein the comparing and readout unit compares the data bit, the mask bit and the search bit signal, so as to determine whether they match each other; and wherein the comparing and readout unit decides whether the data bit and the mask bit can be read out according to the at least one read word signal.

According to another aspect of the present disclosure, another embodiment provides a content addressable memory including: a data memory cell for storing a data bit; a mask memory cell for storing a mask bit; and a comparing and readout unit connected to at least one read word line for receiving at least one read word signal, connected to at least one function bit line for receiving a search bit signal, and connected to the data memory cell and the mask memory cell for receiving the data bit and the mask bit; wherein the data memory cell and the mask memory cell are connected to a write word line for receiving a write word signal, so as to decide whether a data-use write bit signal and a mask-use write bit signal can be written into the data bit and the mask bit through a pair of data-use write bit lines and a pair of mask-use write bit lines; wherein the comparing and readout unit compares the data bit, the mask bit and the search bit signal, so as to determine whether they match each other; and wherein the comparing and readout unit decides whether the data bit and the mask bit can be read out according to the at least one read word signal.

In the embodiment, the at least one function bit line includes a pair of search bit lines and the comparing and readout unit includes: a first transistor stack connected to one of the pair of search bit lines for receiving the search bit signal, and connected to the data memory cell and the mask memory cell for receiving the data bit and the mask bit; and a second transistor stack connected to the other search bit line for receiving the search bit signal, and connected to the data memory cell and the mask memory cell for receiving the data bit and the mask bit; wherein the first and second transistor stacks compare the data bit, the mask bit and the search bit signal to produce a match signal.

In the embodiment, the comparing and readout unit further includes: a first transistor connected to the first transistor stack, the pair of search bit lines, and the at least one read word line for receiving at least one read word signal; and a second transistor connected to the second transistor stack, the pair of search bit lines, and the at least one read word line for receiving at least one read word signal; wherein the first and second transistors decides whether the data bit and the mask bit can be read out according to the at least one read word signal.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For further understanding and recognizing the fulfilled functions and structural characteristics of the disclosure, several exemplary embodiments cooperating with detailed description are presented as the following. Reference will now be made in detail to the preferred embodiments, examples of which are illustrated in the accompanying drawings.

In the following description of the embodiments, it is to be understood that when an element such as a layer (film), region, pattern, or structure is stated as being "on" or "under" another element, it can be "directly" on or under another element or can be "indirectly" formed such that an intervening element is also present. Also, the terms such as "on" or "under" should be understood on the basis of the drawings, and they may be used herein to represent the relationship of one element to another element as illustrated in the figures. It will be understood that this expression is intended to encompass different orientations of the elements in addition to the orientation depicted in the figures, namely, to encompass both "on" and "under". In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
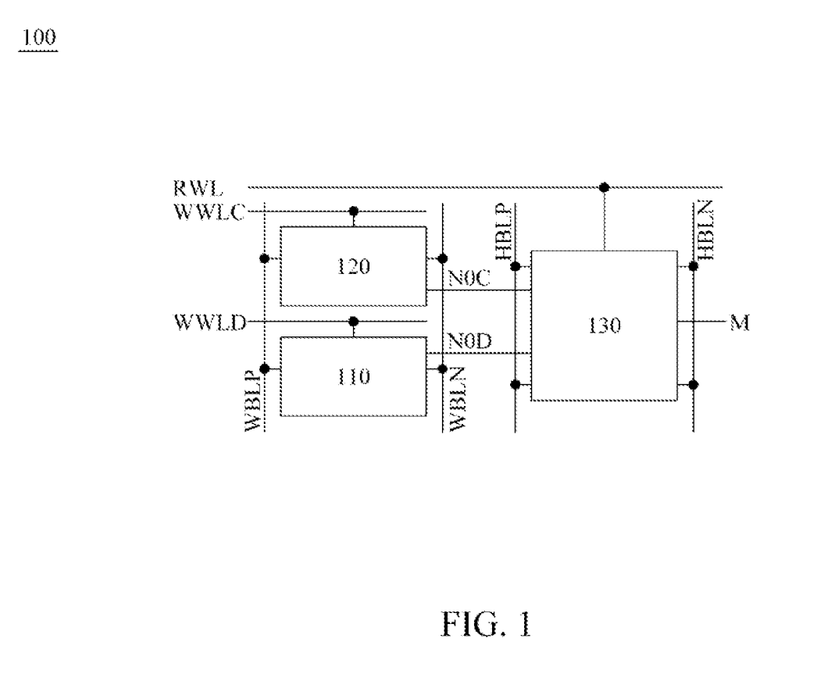
FIG. 1 shows a block diagram of a content addressable memory according to a first embodiment of the present disclosure.

FIG. 1 schematically shows a block diagram of a content addressable memory 100 according to a first embodiment of the present disclosure. The content addressable memory 100, acting as a ternary content addressable memory (TCAM), includes a data memory cell 110 for storing a data bit, a mask memory cell 120 for storing a mask bit, and a comparing and readout unit 130 for reading the data bit N0D and the mask bit N0C as well as comparing the data bit, the mask bit and the search bit signal to determine whether they match each other, so as to produce a match signal M accordingly.

Further, the content addressable memory 100 also includes at least one read word line, at least one function bit line, a data-use write word line, a mask-use write word line, and a pair of write bit line, so that it can identify storage addresses according to the search bit signal, the data bit, and the mask bit as well as access the contents in the storage addresses. Thus, the comparing and readout unit 130 is connected to the at least one read word line for receiving at least one read word signal, to the at least one function bit line for receiving a search bit signal, and to the data memory cell 110 and the mask memory cell 120 for receiving the data bit N0D and the mask bit N0C. Also, it is designed in the embodiment that the data memory cell 110 is connected to a data-use write word line for receiving a data-use write word signal and the mask memory cell 120 is connected to a mask-use write word line for receiving a mask-use write word signal, such that a write bit signal can be controlled to be written into the data bit and the mask bit through the pair of write bit lines.

As shown in FIG. 1, the at least one read word line comprises a read word line RWL, the at least one function bit line comprises a pair of hybrid bit lines HBLP and HBLN, the data-use write word line is denoted as WWLD, the mask-use write word line is denoted as WWLC, and the pair of write bit lines are denoted as WBLP and WBLN. Thus, the comparing and readout unit 130 is connected to the read word line RWL for receiving the read word signal; the comparing and readout unit 130 is connected to the hybrid bit lines HBLP and HBLN for receiving the search bit signal; the comparing and readout unit 130 is also connected to the data memory cell 110 and the mask memory cell 120 for receiving the data bit N0D and the mask bit N0C. Also, the data memory cell 110 is connected to a data-use write word line WWLD for receiving the data-use write word signal, and the mask memory cell 120 is connected to a mask-use write word line WWLC for receiving the mask-use write word signal. Under the control of the data-use write word signal, the content addressable memory 100 can write the write bit signal into the data memory cell 110 and the mask memory cell 120 through the write bit lines WBLP and WBLN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 100 can read out the data bit N0D stored in the data memory cell 110 and the mask bit N0C stored in the mask memory cell 120 through the hybrid bit lines HBLP and HBLN, respectively. The hybrid bit lines HBLP and HBLN are termed as "hybrid" because they can be used either to read the data bit N0D and the mask bit N0C or to transmit the search bit signal.

Figure 2:
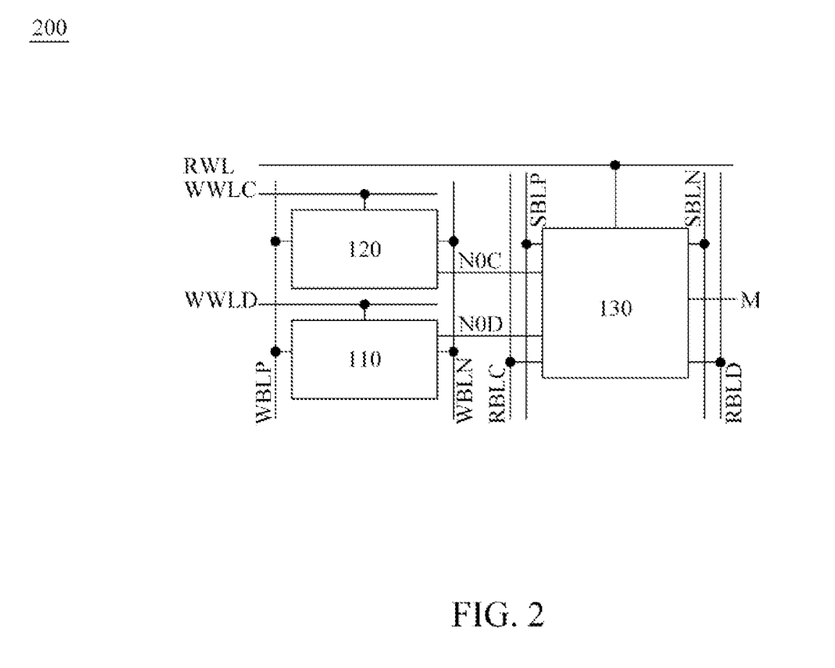
FIG. 2 shows a block diagram of a content addressable memory according to a second embodiment of the present disclosure.

FIG. 2 schematically shows a block diagram of a content addressable memory 200 according to a second embodiment of the present disclosure. The content addressable memory 200 includes a data memory cell 110, a mask memory cell 120, and a comparing and readout unit 130. As shown in FIG. 2, the at least one read word line comprises a read word line RWL, the at least one function bit line comprises a data-use read bit line RBLD, a mask-use read bit line RBLC, and a pair of search bit lines SBLP and SBLN, the data-use write word line is denoted as WWLD, the mask-use write word line is denoted as WWLC, and the pair of write bit lines are denoted as WBLP and WBLN. Thus, the comparing and readout unit 130 is connected to the read word line RWL for receiving the read word signal; the comparing and readout unit 130 is connected to the search bit lines SBLP and SBLN for receiving the search bit signal; the comparing and readout unit 130 is also connected to the data memory cell 110 and the mask memory cell 120 for receiving the data bit N0D and the mask bit N0C. Also, the data memory cell 110 is connected to a data-use write word line WWLD for receiving the data-use write word signal, and the mask memory cell 120 is connected to a mask-use write word line WWLC for receiving the mask-use write word signal.

Under the control of the data-use write word signal, the content addressable memory 200 can write the write bit signal into the data memory cell 110 and the mask memory cell 120 through the write bit lines WBLP and WBLN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 200 can read out the data bit N0D stored in the data memory cell 110 and the mask bit N0C stored in the mask memory cell 120 through the data-use read bit line RBLD and the mask-use read bit line RBLC, respectively.

Figure 3:
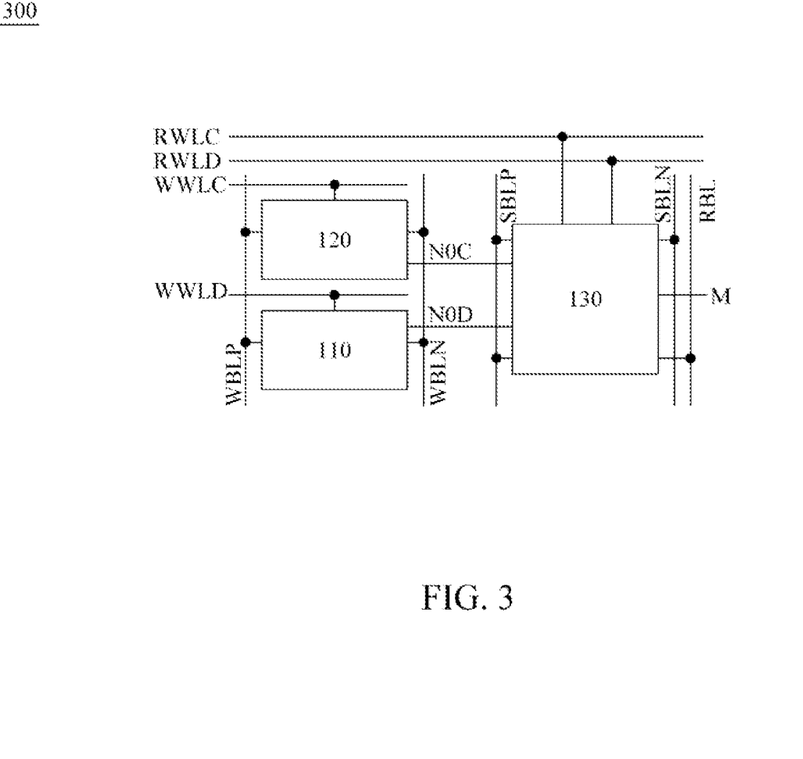
FIG. 3 shows a block diagram of a content addressable memory according to a third embodiment of the present disclosure.

FIG. 3 schematically shows a block diagram of a content addressable memory 300 according to a third embodiment of the present disclosure. The content addressable memory 300 includes a data memory cell 110, a mask memory cell 120, and a comparing and readout unit 130. As shown in FIG. 3, the at least one read word line comprises a data-use read word line RWLD and a mask-use read bit line RBLC, the at least one function bit line comprises a read bit line RBL and a pair of search bit lines SBLP and SBLN, the data-use write word line is denoted as WWLD, the mask-use write word line is denoted as WWLC, and the pair of write bit lines are denoted as WBLP and WBLN. Thus, the comparing and readout unit 130 is connected to the data-use read word line RWLD and the mask-use read bit line RBLC for receiving the data-use and mask-use read word signals, respectively; the comparing and readout unit 130 is connected to the search bit lines SBLP and SBLN for receiving the search bit signal; the comparing and readout unit 130 is also connected to the data memory cell 110 and the mask memory cell 120 for receiving the data bit N0D and the mask bit N0C. Also, the data memory cell 110 is connected to a data-use write word line WWLD for receiving the data-use write word signal, and the mask memory cell 120 is connected to a mask-use write word line WWLC for receiving the mask-use write word signal.

Under the control of the data-use write word signal, the content addressable memory 300 can write the write bit signal into the data memory cell 110 and the mask memory cell 120 through the write bit lines WBLP and WBLN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 300 can read out the data bit N0D stored in the data memory cell 110 and the mask bit N0C stored in the mask memory cell 120, respectively, through the read bit line RBL.

In the first, second, and third embodiments, the data memory cell 110 and the mask memory cell 120 share a pair of write bit lines WBLP and WBLN. However, the data memory cell 110 and the mask memory cell 120 may share only one write word line WWL, and this would be described in detail below.

Figure 4:
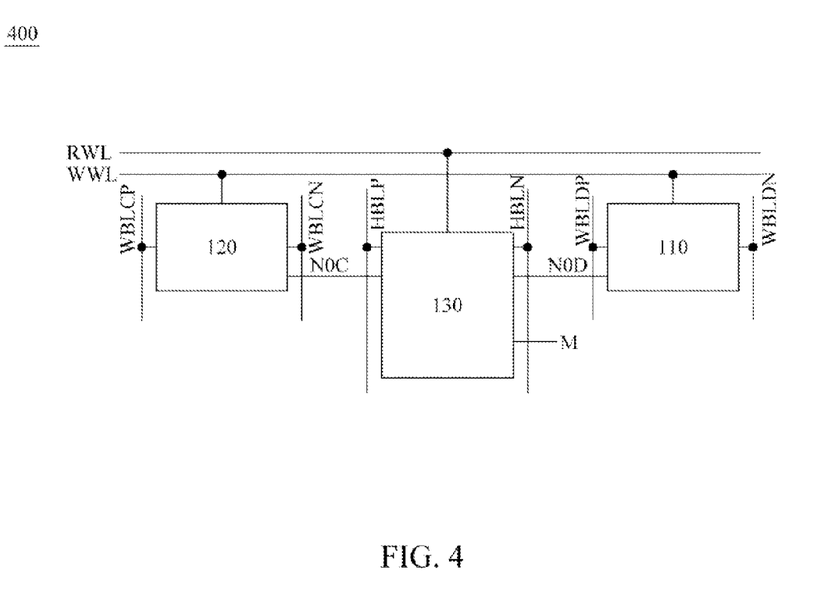
FIG. 4 shows a block diagram of a content addressable memory according to a fourth embodiment of the present disclosure.

FIG. 4 schematically shows a block diagram of a content addressable memory 400 according to a fourth embodiment of the present disclosure. The content addressable memory 400 includes a data memory cell 110, a mask memory cell 120, and a comparing and readout unit 130, acting as a ternary content addressable memory (TCAM). The data memory cell 110, the mask memory cell 120, and the comparing and readout unit 130 of the present embodiment have similar functions and operations to those of the first embodiment, and the redundancies will not be described again.

The content addressable memory 400 further includes at least one read word line, at least one function bit line, a write word line, a pair of data-use write bit lines, and a pair of mask-use write bit lines, so that it can identify storage addresses according to the search bit signal, the data bit N0D, and the mask bit N0C as well as access the contents in the storage addresses. Thus, the comparing and readout unit 130 is connected to the at least one read word line for receiving at least one read word signal, to the at least one function bit line for receiving a search bit signal, and to the data memory cell 110 and the mask memory cell 120 for receiving the data bit and the mask bit. Also, it is designed in the embodiment that the data memory cell 110 and the mask memory cell 120 are connected to the write word line for receiving a write word signal, such that a data-use write bit signal can be controlled to be written into the data bit through the pair of data-use write bit lines, and a mask-use write bit signal can be controlled to be written into the mask bit through the pair of mask-use write bit lines.

As shown in FIG. 4, the at least one read word line comprises a read word line RWL, the at least one function bit line comprises a pair of hybrid bit lines HBLP and HBLN, the write word line is denoted as WWL, the pair of data-use write bit lines are denoted as WBLDP and WBLDN, and the pair of mask-use write bit lines are denoted as WBLCP and WBLCN. Thus, the comparing and readout unit 130 is connected to the read word line RWL for receiving the read word signal; the comparing and readout unit 130 is connected to the hybrid bit lines HBLP and HBLN for receiving the search bit signal; the comparing and readout unit 130 is connected to the data memory cell 110 and the mask memory cell 120 for receiving the data bit N0D and the mask bit N0C; and the comparing and readout unit 130 is also connected to the write word line WWL for receiving the write word signal. Under the control of the write word signal, the content addressable memory 400 can write the data-use write bit signal into the data memory cell 110 through the data-use write bit lines WBLDP and WBLDN, and write the mask-use write bit signal into the mask memory cell 120 through the mask-use write bit lines WBLCP and WBLCN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 400 can read out the data bit N0D stored in the data memory cell 110 and the mask bit N0C stored in the mask memory cell 120 through the hybrid bit lines HBLP and HBLN, respectively. Again, the hybrid bit lines HBLP and HBLN are termed as "hybrid" because they can be used either to read the data bit N0D and the mask bit N0C or to transmit the search bit signal.

Figure 5:
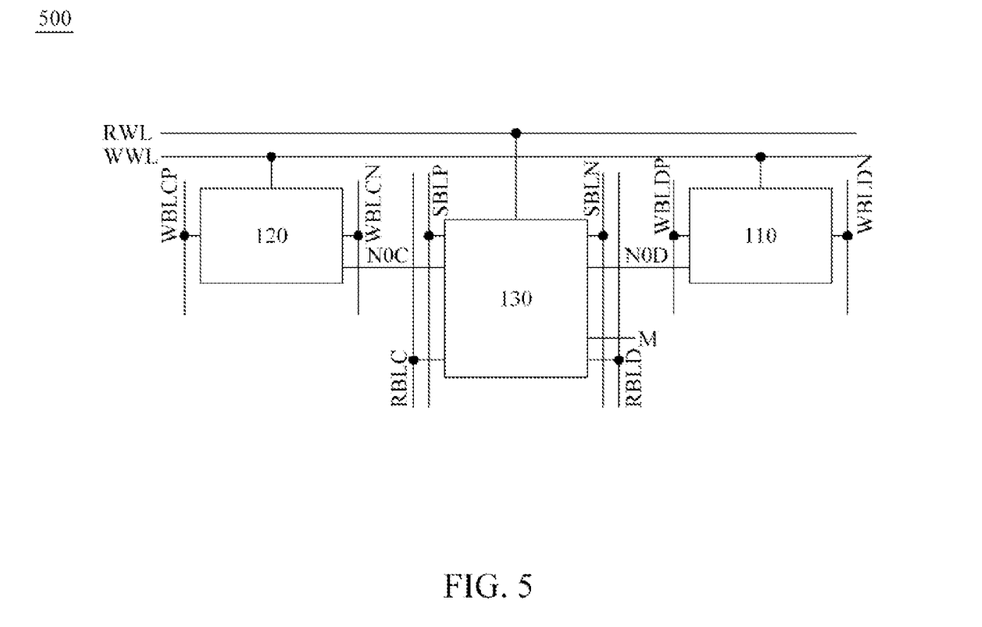
FIG. 5 shows a block diagram of a content addressable memory according to a fifth embodiment of the present disclosure.

FIG. 5 schematically shows a block diagram of a content addressable memory 500 according to a fifth embodiment of the present disclosure. The content addressable memory 500 includes a data memory cell 110, a mask memory cell 120, and a comparing and readout unit 130. As shown in FIG. 5, the at least one read word line comprises a read word line RWL, the at least one function bit line comprises a data-use read bit line RBLD, a mask-use read bit line RBLC, and a pair of search bit lines SBLP and SBLN, the write word line is denoted as WWL, the pair of data-use write bit lines are denoted as WBLDP and WBLDN, and the pair of mask-use write bit lines are denoted as WBLCP and WBLCN. Thus, the comparing and readout unit 130 is connected to the read word line RWL for receiving the read word signal; the comparing and readout unit 130 is connected to the search bit lines SBLP and SBLN for receiving the search bit signal; the comparing and readout unit 130 is connected to the data memory cell 110 and the mask memory cell 120 for receiving the data bit N0D and the mask bit N0C; and the data memory cell 110 and the mask memory cell 120 are connected to the write word line WWL for receiving the write word signal.

Thus, under the control of the write word signal, the content addressable memory 500 can write the data-use write bit signal into the data memory cell 110 through the data-use write bit lines WBLDP and WBLDN, and write the mask-use write bit signal into the mask memory cell 120 through the mask-use write bit lines WBLCP and WBLCN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 500 can read out the data bit N0D stored in the data memory cell 110 and the mask bit N0C stored in the mask memory cell 120 through the data-use read bit line RBLD and the mask-use read bit line RBLC, respectively.

Figure 6:
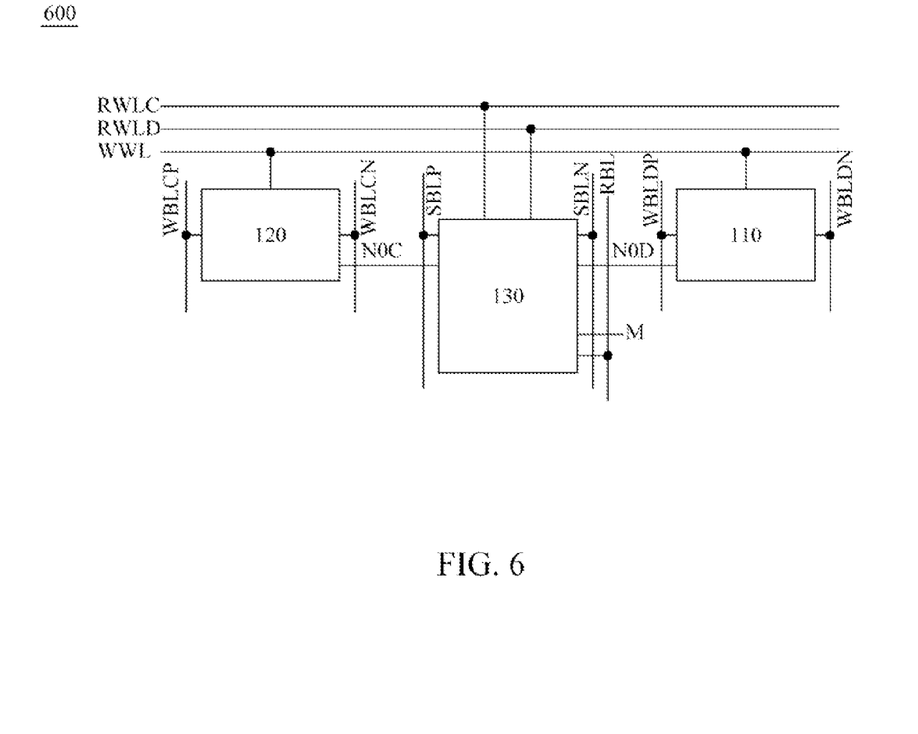
FIG. 6 shows a block diagram of a content addressable memory according to a sixth embodiment of the present disclosure.

FIG. 6 schematically shows a block diagram of a content addressable memory 600 according to a sixth embodiment of the present disclosure. The content addressable memory 600 includes a data memory cell 110, a mask memory cell 120, and a comparing and readout unit 130. As shown in FIG. 6, the at least one read word line comprises a data-use read word line RWLD and a mask-use read word line RWLC, the at least one function bit line comprises a read bit line RBL and a pair of search bit lines SBLP and SBLN, the write word line is denoted as WWL, the pair of data-use write bit lines are denoted as WBLDP and WBLDN, and the pair of mask-use write bit lines are denoted as WBLCP and WBLCN. Thus, the comparing and readout unit 130 is connected to the data-use read word line RWLD and the mask-use read word line RWLC for receiving the data-use and mask-use read word signals, respectively; the comparing and readout unit 130 is connected to the search bit lines SBLP and SBLN for receiving the search bit signal; the comparing and readout unit 130 is connected to the data memory cell 110 and the mask memory cell 120 for receiving the data bit N0D and the mask bit N0C; and the data memory cell 110 and the mask memory cell 120 are connected to the write word line WWL for receiving the write word signal.

Thus, under the control of the write word signal, the content addressable memory 600 can write the data-use write bit signal into the data memory cell 110 through the data-use write bit lines WBLDP and WBLDN, and write the mask-use write bit signal into the mask memory cell 120 through the mask-use write bit lines WBLCP and WBLCN. The comparing and readout unit 130 may compare the search bit signal, the data bit N0D, and the mask bit N0C, so as to determine whether they match each other or not and to produce the match signal M. The match signal M is logic HIGH if the search bit signal, the data bit N0D, and the mask bit N0C match each other, while the match signal M is logic LOW if the search bit signal, the data bit N0D, and the mask bit N0C do not match each other. Moreover, under the control of the read word signal, the content addressable memory 600 can read out the data bit N0D stored in the data memory cell 110 and the mask bit N0C stored in the mask memory cell 120 through the read bit line RBL.

Figure 7:
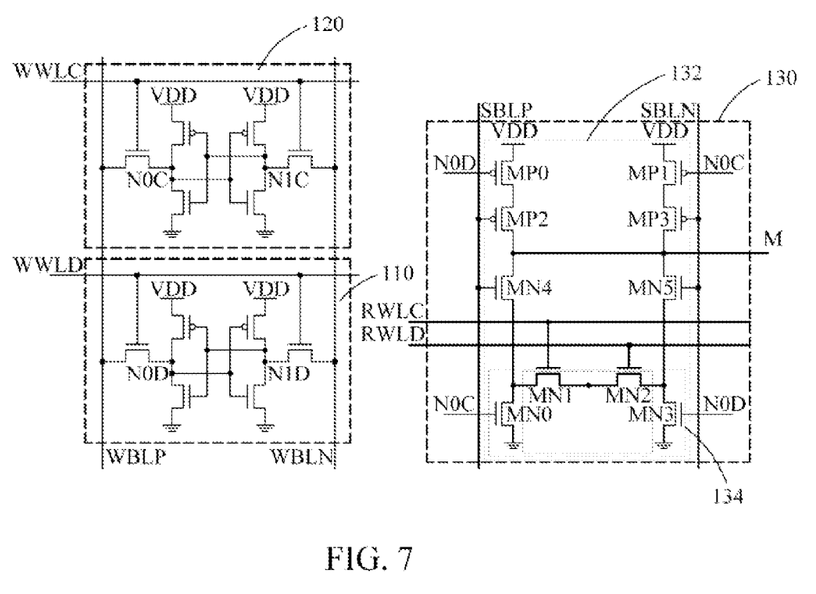
FIG. 7 shows a circuit diagram of the content addressable memory based on the SRAM cells and MOS transistors.

In the above embodiments, each of the data memory cell 110 and the mask memory cell 120 may comprise a SRAM (Static Random Access Memory) device, e.g. a 6T-SRAM memory cell composed of six transistors as shown in FIG. 7. The information about SRAM has been described in the prior art and is not described redundantly here. To realize the TCAM circuit in the embodiments, FIG. 7 shows a circuit diagram of the content addressable memory based on the SRAM cells and MOS transistors, taking the third or sixth embodiment as an example.

As shown in FIG. 7, the comparing and readout unit 130 includes a first transistor stack and a second transistor stack. Wherein, the first transistor stack is composed of two p-type transistors MP0 and MP2 and two n-type transistors MN4 and MN0 cascaded in series and in sequence, and the second transistor stack is composed of two p-type transistors MP1 and MP3 and two n-type transistors MN5 and MN3 cascaded in series and in sequence. Considering the first transistor stack, the source terminal of the transistor MP0 is connected to a DC power supply with voltage VDD, its gate terminal is connected to the data memory cell 110 for receiving the data bit N0D, and its drain terminal is connected to the source terminal of the transistor MP2. The gate terminal of the transistor MP2 is connected to the search bit line SBLP for receiving the search bit signal, and its drain terminal is connected to the drain terminal of the transistor MN4. The gate terminal of the transistor MN4 is also connected to the search bit line SBLP for receiving the search bit signal, and its source terminal is connected to the drain terminal of the transistor MN0. The gate terminal of the transistor MN0 is connected to the mask memory cell 120 for receiving the mask bit N0C, and its source terminal is grounded. Considering the second transistor stack, the source terminal of the transistor MP1 is connected to the DC power supply VDD, its gate terminal is connected to the mask memory cell 120 for receiving the mask bit N0C, and its drain terminal is connected to the source terminal of the transistor MP3. The gate terminal of the transistor MP3 is connected to the search bit line SBLN for receiving the search bit signal, and its drain terminal is connected to the drain terminal of the transistor MN5. The gate terminal of the transistor MN5 is also connected to the search bit line SBLN for receiving the search bit signal, and its source terminal is connected to the drain terminal of the transistor MN3. The gate terminal of the transistor MN3 is connected to the data memory cell 110 for receiving the data bit N0D, and its source terminal is grounded. The connection terminal between the drain terminals of the transistors MP2 and MN4 is connected to the connection terminal between the drain terminals of the transistors MP3 and MN5, so as to output the match signal M.

In the embodiment, the combination of the transistors MP0, MP1, MP2, MP3, MN0, MN3, MN4 and MN5 acts as a comparison circuit 132, which compares the search bit signal, the data bit N0D, and the mask bit N0C to determine whether they match each other or not. That is, the comparison circuit 132 compares the stored contents, i.e. the data bit N0D and the mask bit N0C, in the data memory cell 110 and the mask memory cell 120 with the inputted contents, i.e. the search bit signals, from the search bit lines SBLP and SBLN. Each stored content includes three possible states: "0", "1" and "don't care", which are stored in the combination of the data bit N0D and the mask bit N0C. The comparison circuit 132 compares the stored contents and the inputted contents based on the operation of the logic XOR (exclusive-OR) gate. The comparison circuit 132 may produce logic HIGH or "1" as the match signal M, if the stored contents are identical to the inputted contents or the stored contents are "don't care". Otherwise, the comparison circuit 132 may produce logic LOW or "0" as the match signal M. Thus, we have the truth table below.

| Mask Bit N0C | Data Bit N0D | Stored Content | Search Bit Signal | Match Signal M |
|---|---|---|---|---|
| 0 | 0 | Don't Care | Don't Care | 1 |
| 0 | 1 | 1 | 0 | 0 |
| 1 | 0 | 0 | 0 | 1 |
| 0 | 1 | 1 | 1 | 1 |
| 1 | 0 | 0 | 1 | 0 |
| 1 | 1 | Non-Exist | Don't Care | Non-Exist |

As shown in FIG. 7, the comparing and readout unit 130 further includes n-type transistors MN1 and MN2. The combination of the transistors MN1 and MN2, the transistor MN0 in the first transistor stack, and the transistors MN3 in the second transistor stack acts as a readout circuit 134. Wherein, the drain terminal of the transistor MN1 is connected to the read bit line RBL, its gate terminal is connected to the mask-use read word line RWLC, and its source terminal is connected to the drain terminal of the transistor MN0. The drain terminal of the transistor MN2 is also connected to the read bit line RBL, its gate terminal is connected to the data-use read word line RWLD, and its source terminal is connected to the drain terminal of the transistor MN3.

So, when the data-use read word signal is logic HIGH, the content addressable memory 300 or 600 can read the data bit N0D out through the read bit line RBL. while when the mask-use read word signal is logic HIGH, the content addressable memory 300 or 600 can read the mask bit N0C out through the read bit line RBL. Please be noticed that the comparison circuit 132 (including transistors MP0, MP1, MP2, MP3, MN0, MN3, MN4 and MN5) and the readout circuit 134 (including transistors MN0, MN1, MN2 and MN3) share two transistors MN0 and MN3. That is to say, the comparison circuit and the readout circuit in the conventional content addressable memory have been incorporated into the comparing and readout unit 130 in the above embodiments, and this saves the content addressable memory two transistors, from 12 to 10 transistors therein. The manufacturing cost would thus be remarkably lowered. Furthermore, the data bit is read out and written in through different signal paths in the embodiments, and this can prevent the occurrence of the "disturbance in word lines" problem in the prior art, when the word line is logic HIGH but nothing is read out or written in.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A content addressable memory comprising:
a data memory cell for storing a data bit;
a mask memory cell for storing a mask bit; and
a comparing and readout unit connected to at least one read word line for receiving at least one read word signal, connected to at least one function bit line for receiving a search bit signal, and connected to the data memory cell and the mask memory cell for receiving the data bit and the mask bit, wherein said at least one function bit line includes a pair of search bit lines;
wherein the data memory cell is connected to a data-use write word line for receiving a data-use write word signal, the mask memory cell is connected to a mask-use write word line for receiving a mask-use write word signal, so as to decide whether a write bit signal can be written into the data bit and the mask bit through a pair of write bit lines;
wherein the comparing and readout unit compares the data bit, the mask bit and the search bit signal, so as to determine whether they match each other;
wherein the comparing and readout unit decides whether the data bit and the mask bit can be read out according to the at least one read word signal; and
wherein the comparing and readout unit includes:
a first transistor stack connected to one of the pair of search bit lines for receiving the search bit signal, and connected to the data memory cell and the mask memory cell for receiving the data bit and the mask bit; and
a second transistor stack connected to the other search bit line for receiving the search bit signal, and connected to the data memory cell and the mask memory cell for receiving the data bit and the mask bit, wherein the first and second transistor stacks compares the data bit, the mask bit and the search bit signal to produce a match signal;
a first transistor connected to the first transistor stack, the pair of search bit lines, and the at least one read word line for receiving at least one read word signal; and
a second transistor connected to the second transistor stack, the pair of search bit lines, and the at least one read word line for receiving at least one read word signal;
wherein the first and second transistors decides whether the data bit and the mask bit can be read out according to the at least one read word signal.

2. The content addressable memory according to claim 1, wherein the at least one function bit line includes a pair of hybrid bit lines, and if the comparing and readout unit decides that the data bit and the mask bit can be read out, then they are read out through the pair of hybrid bit lines.

3. The content addressable memory according to claim 1, wherein the at least one function bit line includes a data-use read bit line, a mask-use read bit line, and a pair of search bit lines, and if the comparing and readout unit decides that the data bit and the mask bit can be read out, then they are read out through the data-use read bit line and the mask-use read bit line, respectively.

4. The content addressable memory according to claim 1, wherein the at least one read word line includes a data-use read word line and a mask-use read word line, the at least one read word signal includes a data-use read word signal, the at least one function bit line includes a read bit line and a pair of search bit lines, and if the comparing and readout unit decides that the data bit and the mask bit can be read out, then they are read out through the read bit line.

5. The content addressable memory according to claim 1, wherein the data memory cell includes a first SRAM device and the mask memory cell includes a second SRAM device.

6. A content addressable memory comprising:
a data memory cell for storing a data bit;
a mask memory cell for storing a mask bit; and
a comparing and readout unit connected to at least one read word line for receiving at least one read word signal, connected to at least one function bit line for receiving a search bit signal, and connected to the data memory cell and the mask memory cell for receiving the data bit and the mask bit, wherein said at least one function bit line includes a pair of search bit lines;

wherein the data memory cell and the mask memory cell are connected to a write word line for receiving a write word signal, so as to decide whether a data-use write bit signal and a mask-use write bit signal can be written into the data bit and the mask bit through a pair of data-use write bit lines and a pair of mask-use write bit lines;

wherein the comparing and readout unit compares the data bit, the mask bit and the search bit signal, so as to determine whether they match each other;

wherein the comparing and readout unit decides whether the data bit and the mask bit can be read out according to the at least one read word signal; and wherein the comparing and readout unit includes:
- a first transistor stack connected to one of the pair of search bit lines for receiving the search bit signal, and connected to the data memory cell and the mask memory cell for receiving the data bit and the mask bit; and
- a second transistor stack connected to the other search bit line for receiving the search bit signal, and connected to the data memory cell and the mask memory cell for receiving the data bit and the mask bit, wherein the first and second transistor stacks compare the data bit, the mask bit and the search bit signal to produce a match signal;
- a first transistor connected to the first transistor stack, the pair of search bit lines, and the at least one read word line for receiving at least one read word signal; and
- a second transistor connected to the second transistor stack, the pair of search bit lines, and the at least one read word line for receiving at least one read word signal;

wherein the first and second transistors decides whether the data bit and the mask bit can be read out according to the at least one read word signal.

7. The content addressable memory according to claim 6, wherein the at least one function bit line includes a pair of hybrid bit lines, and if the comparing and readout unit decides that the data bit and the mask bit can be read out, then they are read out through the pair of hybrid bit lines.

8. The content addressable memory according to claim 6, wherein the at least one function bit line includes a data-use read bit line, a mask-use read bit line, and a pair of search bit lines, and if the comparing and readout unit decides that the data bit and the mask bit can be read out, then they are read out through the data-use read bit line and the mask-use read bit line, respectively.

9. The content addressable memory according to claim 6, wherein the at least one read word line includes a data-use read word line and a mask-use read word line, the at least one read word signal includes a data-use read word signal, the at least one function bit line includes a read bit line and a pair of search bit lines, and if the comparing and readout unit decides that the data bit and the mask bit can be read out, then they are read out through the read bit line.

10. The content addressable memory according to claim 6, wherein the data memory cell includes a first SRAM device and the mask memory cell includes a second SRAM device.

* * * * *